United States Patent [19]
Asao et al.

[11] Patent Number: 5,410,277
[45] Date of Patent: Apr. 25, 1995

[54] STABILIZED FREQUENCY SYNTHESIZER

[75] Inventors: Hideki Asao, Kanagawa; Yutaka Ozaki, Hyogo; Tetsu Owada; Hideyuki Oh-Hashi, both of Kanagawa, all of Japan

[73] Assignee: Mitsubishi Denki Kabushiki Kaisha, Tokyo, Japan

[21] Appl. No.: 259,867

[22] Filed: Jun. 15, 1994

[30] Foreign Application Priority Data

Jun. 18, 1993 [JP] Japan .................. 5-147452

[51] Int. Cl.⁶ .................. H03B 5/18; H03L 7/07; H03L 7/087; H03L 7/18
[52] U.S. Cl. .................. 331/10; 331/11; 331/17; 331/25; 331/34; 331/96; 331/107 DP; 331/108 R; 331/177 R
[58] Field of Search ............ 331/5, 8, 10, 11, 12, 331/17, 18, 25, 34, 86, 88, 90, 97, 107 A, 177 R, 108 R, 187

[56] References Cited
U.S. PATENT DOCUMENTS

| | | | |
|---|---|---|---|
| 4,366,467 | 12/1982 | Cushman | 340/347 |
| 4,571,552 | 2/1986 | Brown | 331/25 X |
| 4,602,220 | 7/1986 | Kurihara | 331/25 X |
| 4,728,906 | 3/1988 | Turl et al. | 331/10 X |
| 4,873,496 | 10/1989 | Ohgihara et al. | 331/96 |
| 4,887,052 | 12/1989 | Murakami et al. | 331/96 |
| 4,890,071 | 12/1989 | Curtis | 331/11 |
| 4,918,405 | 4/1990 | Herleikson | 331/176 X |
| 5,130,670 | 7/1992 | Jaffe | 331/25 X |

Primary Examiner—David Mis
Attorney, Agent, or Firm—Wolf, Greenfield & Sacks

[57] ABSTRACT

A frequency synthesizer, which controls the fluctuation of frequency not only of a long period but also a short period, ensures a wide frequency control range and can be realized at a low cost, can be obtained. The frequency synthesizer includes a first control circuit and a second control circuit, the first control circuit having a first variable frequency divider connected between a coupler for extracting a part of an oscillator and a main coil disposed within a magnetic circuit, a first phase detector, a first reference signal generator, a first loop filter and a first coil driving circuit and the second control circuit having a second variable frequency divider connected between said coupler and a sub-coil disposed in said magnetic circuit, a second phase detector, a second reference signal generator, a second loop filter and a second coil driving circuit in order to share the roles in such a manner that the first control circuit controls the fluctuation of the long period frequency, while the second control circuit controls the fluctuation of the short period frequency.

18 Claims, 12 Drawing Sheets

STABILIZED FREQUENCY SYNTHESIZER

BACKGROUND OF THE INVENTION

1. Field of the Invention

The present invention relates to a frequency stabilizer for obtaining a stabilized frequency signal depending on predetermined frequency settings in the microwave and millimeter wave frequency bands, or the like.

2. Description of the Prior Art

It is well known for those skilled in the art to use a magnetic resonator in a high frequency oscillator. The Japanese Patent Laid-Open No. 140803/1989 (corresponding to the U.S. Pat. No. 4,887,052) discloses an example of this structure.

FIG. 1 illustrates the structure of a typical example of frequency synthesizers in the prior art. In FIG. 1, the frequency synthesizer comprises a magnetic resonator 1, a magnetic circuit 2 for applying a magnetic field to the magnetic resonator 1, a main coil 3 and a yoke 4 forming the magnetic circuit, an active element 5 connected to the resonator 1 and a matching/amplifying circuit 6. An oscillator is formed by the magnetic resonator 1, magnetic circuit 2, active element 5 and matching/amplifying circuit 6. The frequency synthesizer further includes a coupler 8 connected to the oscillator 7, a variable frequency divider 9 mutually connected between the terminal of coupler 8 and the terminal of the coil 3, a phase detector 10, a reference signal generator 11, a loop filter 12, a coil driving circuit 13 and a feedback circuit 16 connected to the active element 5.

Moreover, the coupler 8 is connected to the oscillation output terminal 14, while the variable frequency divider 9 is connected to the frequency setting input terminal 16.

Next, the operation of the frequency synthesizer will be explained. The magnetic resonator 1 has a resonance frequency in a microwave or millimeter wave frequency band which is determined by the magnetic field generated in the magnetic circuit 2. In this case, when the structure of the magnetic resonator 1 and circuit constants of the feedback circuit 16 and matching/amplifying circuit 6 are selected so that the product $|\Gamma 1|\cdot|\beta 2|$ of the absolute values of the complex reflection coefficients $\Gamma 1$ and $\Gamma 2$ is equal to or greater than one and the sum $\angle \Gamma 1 + \angle \Gamma 2$ of phase angles $\angle \Gamma 1$ and $\angle \Gamma 2$ is zero, where $\Gamma 1$ is the reflection coefficient of the magnetic resonator 1 observed from the active element 5 such as a transistor and $\Gamma 2$ is the complex reflection coefficient of the active element 5 observed from the magnetic resonator 1, an electromagnetic wave is amplified each time it passes forward and backward between the active element 5 and magnetic resonator 1 and the amplification is continued until the active element 5 is saturated. As a result, oscillation is established. This oscillating output can be extracted from the oscillation output terminal 14 through the matching/amplifying circuit 6 and coupler 8.

The frequency of this oscillation output is determined by the magnetic field generated by the current flowing through the coil 3 of the magnetic circuit 2.

When the frequency division ratio of the variable frequency divider is set to "n" through the frequency setting input terminal 15, the frequency $f_1$ of the oscillation output signal extracted by the coupler 8 is divided into $f_1/n$ and this frequency-divided signal and the fixed frequency $f_2$ obtained from the reference signal generator 11 utilizing a crystal oscillator as the oscillation source are put to the phase detector 10, a voltage corresponding to $f_1/n - f_2$ can be obtained as an output. As shown in FIG. 2, variations in voltage with time include short period changes caused by noise and long period changes with temperature which are superimposed on each other. In general, this output voltage of the phase detector is applied to the loop filter 12 operating as a low-frequency band-pass filter in order to extract a voltage signal having periodic components of about several kHz or lower and this voltage is then reduced to 0 V by controlling the current flowing through the coil driving circuit 13. As a result, the fluctuation of the oscillating frequency of about several kHz or less can be controlled and stabilized as shown in FIG. 3. In this case, frequency spectrum characteristics near the oscillating frequency are shown in FIG. 4, where spectra, that is, phase noises corresponding to the frequency fluctuation components indicated by a broken line are suppressed. Moreover, since such control is carried out so that $f_1/n - f_2 = 0$ can be obtained, the oscillating frequency $f_1$ can be varied by changing the frequency division ratios "n" applied through the frequency setting input terminal 15.

Since the frequency synthesizer in the prior arts is arranged as explained heretofore, any attempt to obtain a pure signal by controlling the fluctuation of the oscillating frequency having shorter periods as shown in FIG. 5 results in a problem that the resistance offered to the flow of a coil current of high frequency becomes strong due to the self-inductance of the coil 3 even when the upper limit of the pass-band frequency of the loop filter 12 is made higher. Moreover, since the coil current lags the output voltage of the loop filter 12, control of fluctuation of the oscillating frequency is difficult. Moreover, when self-inductance is lowered, for example, by reducing the number of turns of coil 3, there arises a problem that a large coil current is required for obtaining the predetermined frequency control range and a current amplifying transistor having a large current capacity is required for the coil driving circuit 13, resulting in an increase in cost. In addition, there is a problem that heat generation by the coil 3 increases and the change in temperature of the magnetic resonator 1 and magnetic circuit 2 will become larger than that in the ambient temperature.

SUMMARY OF THE INVENTION

In view of the problems explained above, it is an object of the present invention to provide a frequency synthesizer which controls not only the fluctuation of the oscillating frequency having a longer period but also the fluctuation of the oscillating frequency having a shorter period. Moreover, it is a further object to ensure a wide frequency control range which can be realized with a low cost.

According to a first feature of the present invention, in a frequency synthesizer which is provided with a magnetic resonator, a magnetic circuit for applying a magnetic field to the magnetic resonator and a control system for controlling the driving current of the magnetic circuit on the basis of the oscillating frequency of the oscillator having the magnetic resonator to stabilize the oscillating frequency, the magnetic circuit comprises a long period signal control coil and a short period signal control coil for applying a predetermined magnetic field to the magnetic resonator. The synthesizer further comprises a long period signal control coil control system for controlling the driving current of the long period signal control coil on the basis of the oscillating frequency of the oscillator and a short period signal control coil control system for controlling the driving current of the short period signal control coil, the long period signal control coil control system being provided with a first filter having a high cut-off frequency for blocking the flow of the short period signal for the short period signal control coil to the long period signal control coil and the short period signal control coil control system being provided with a second filter having a high cut-off frequency higher than the cut-off frequency of the first filter for realizing a predetermined phase noise characteristic in order to control the driving currents of the long period signal control coil and the short period signal control coil.

The frequency synthesizer arranged as explained above enables control of driving currents for the long period signal control coil and the short period signal control coil by using the long period signal control coil and the short period control coil for applying the predetermined magnetic field to the magnetic resonator, the long period signal control coil control system being provided with the first filter having a high cut-off frequency for preventing the short period signal for the short period signal control coil from entering the long period signal control coil and the short period signal control coil control system being provided with the second filter having a high cut-off frequency higher than the cut-off frequency of the first filter to realize the predetermined phase noise characteristic. Therefore, the frequency synthesizer thus constructed shares the roles so that the long period signal control coil control system controls fluctuations of the frequency of longer period, while the short period signal control coil control system controls fluctuation of the frequency of short period and moreover can suppress the fluctuation of the oscillating frequency having a short period due to noise or the like by widening the frequency control range with the long period signal control coil and sufficiently reducing the inductance of the short period signal control coil.

According to a second feature of the present invention, in a frequency synthesizer which is provided with a magnetic resonator, a magnetic circuit for applying a magnetic field to the magnetic resonator and a control system for controlling the driving current of the magnetic circuit on the basis of the oscillating frequency of the oscillator having the magnetic resonator in order to stabilize the oscillating frequency, the magnetic circuit comprises a bias coil, a long period signal control coil and a short period signal control coil having inductances smaller than that of the bias coil in order to apply a predetermined magnetic field to the magnetic resonator. The synthesizer further comprises a bias coil control system for controlling the DC driving current of the bias coil on the basis of a frequency settings signal, a long period signal control coil control system for controlling the driving current of the long period signal control coil on the basis of the oscillating frequency of the oscillator, and a short period signal control coil control system for controlling the driving current of the short period signal control coil, the long period signal control coil control system being provided with a first filter having a high cut-off frequency for blocking the flow of the short period signal for the short period signal control coil to the long period signal control coil, the short period signal control coil control system being provided with a second filter having a high cut-off frequency higher than the cut-off frequency of the first filter for realizing a determined phase noise characteristic, and a DC driving current for stimulating the oscillator having the magnetic resonator in oscillation with the predetermined oscillating frequency being applied to the bias coil in order to control the driving currents of the long period signal control coil and the short period signal control coil.

The frequency synthesizer constructed as explained above enables control of the driving current of each coil by providing in the magnetic circuit, for applying the predetermined magnetic field to the magnetic resonator, the bias coil, and the long period signal control coil, and the short period signal control coil having inductances smaller than that of the bias coil. Therefore, the frequency synthesizer thus can widen the frequency control range by flowing a large DC current through the bias coil and can reduce the phase difference between an output voltage and a coil current of the long period signal control coil control system to perform high accuracy control by making sufficiently smaller than the inductance of the long period signal control coil.

According to a third feature of the present invention, in a frequency synthesizer provided with a magnetic resonator, a magnetic circuit for applying a magnetic field to the magnetic resonator and a control system for controlling the driving current of the magnetic circuit on the basis of the oscillating frequency of the oscillator having the magnetic resonator in order to stabilize the oscillating frequency, the magnetic circuit comprises, in order to apply the predetermined magnetic field to the magnetic resonator, a long period signal control coil and a short period signal control coil having an inductance smaller than that of the long period signal control coil. The synthesizer further comprises a bias coil control system for controlling the DC driving current of the long period signal control coil on the basis of a frequency setting signal, a long period signal control coil control system for controlling the driving current of the long period signal control coil on the basis of the oscillating frequency of the oscillator, and a short period signal control coil control system for controlling the driving current of the short period signal control coil, the long period signal control coil control system being provided with a first filter having a high cut-off frequency for blocking the flow of the short period signal for the short period signal control coil to the long period signal control coil, the short period signal control coil control system being provided with a second filter having a cut-off frequency higher than the cut-off frequency of the first filter to realize a predetermined phase noise characteristic, and a driving current of the long period signal control coil control system being applied to the long period signal control coil in addition to the driving current for oscillating the oscillator having the magnetic resonator with the predetermined oscillating frequency in order to control the driving currents of the long period signal control coil and short period signal control coil.

The frequency synthesizer constructed as explained above comprises, within the magnetic circuit, a long period signal control coil and a short period signal control coil for applying the predetermined magnetic field to the magnetic resonator and performs the control by supplying the long period signal control coil with the driving current of the long period signal control coil control system in addition to the DC driving current for stimulating the oscillator having the magnetic resonator in oscillation with the predetermined oscillating frequency, to thereby sufficiently reduce the inductance of the long period signal control coil and obtain an approximately desired frequency with the DC driving current to widen the frequency control range and enable high accuracy control without using the bias coil.

According to a fourth feature of the present invention, in a frequency synthesizer provided with a magnetic resonator, a magnetic circuit for applying a magnetic field to the magnetic resonator and a control system for controlling the driving current of the magnetic circuit on the basis of the oscillating frequency of the oscillator having the magnetic resonator to stabilize the oscillating frequency, the magnetic circuit comprises at least a long period signal control coil and a short period control coil for applying a predetermined magnetic field to the magnetic resonator, a long period signal control coil control system for controlling the driving current of the long period signal control coil on the basis of the oscillating frequency of the oscillator and a short period signal control coil control system for controlling the driving current of the short period signal control coil, the long period signal control coil control system being provided with a first filter having a high cut-off frequency for blocking the flow of the short period signal for the short period signal control coil to the long period signal control coil and the short period signal control coil control system being provided with a second filter having a high cut-off frequency higher than the cut-off frequency of the first filter to realize a predetermined phase noise characteristic in serial connection with an output terminal of the filter of the long period signal control coil control system in order to perform the control of driving currents of the long period signal control coil and short period signal control coil.

The frequency synthesizer constructed as explained above comprises, within the magnetic circuit, at least a long period signal control coil and a short period control coil for applying the predetermined magnetic field to the magnetic resonator. The synthesizer further includes a first filter, within the long period signal control coil control system, having a high cut-off frequency for preventing the short period signal for the short period signal control coil from entering the long period signal control coil and a second filter, within the short period signal control coil control system, having a high cut-off frequency higher than the cut-off frequency of the first filter to realize the predetermined phase noise characteristic in serial connection with an output terminal of the filter of the long period signal control coil control system. The frequency synthesizer thus arranged can operate while avoiding the dead-band of the short period signal control coil control system and can perform the stabilized frequency control.

BRIEF DESCRIPTION OF THE DRAWINGS

The foregoing features and other aspects of the invention are explained in the following detailed description in connection with the accompanying drawings wherein.

DETAILED DESCRIPTION OF THE PREFERRED EMBODIMENTS

Figure 6:
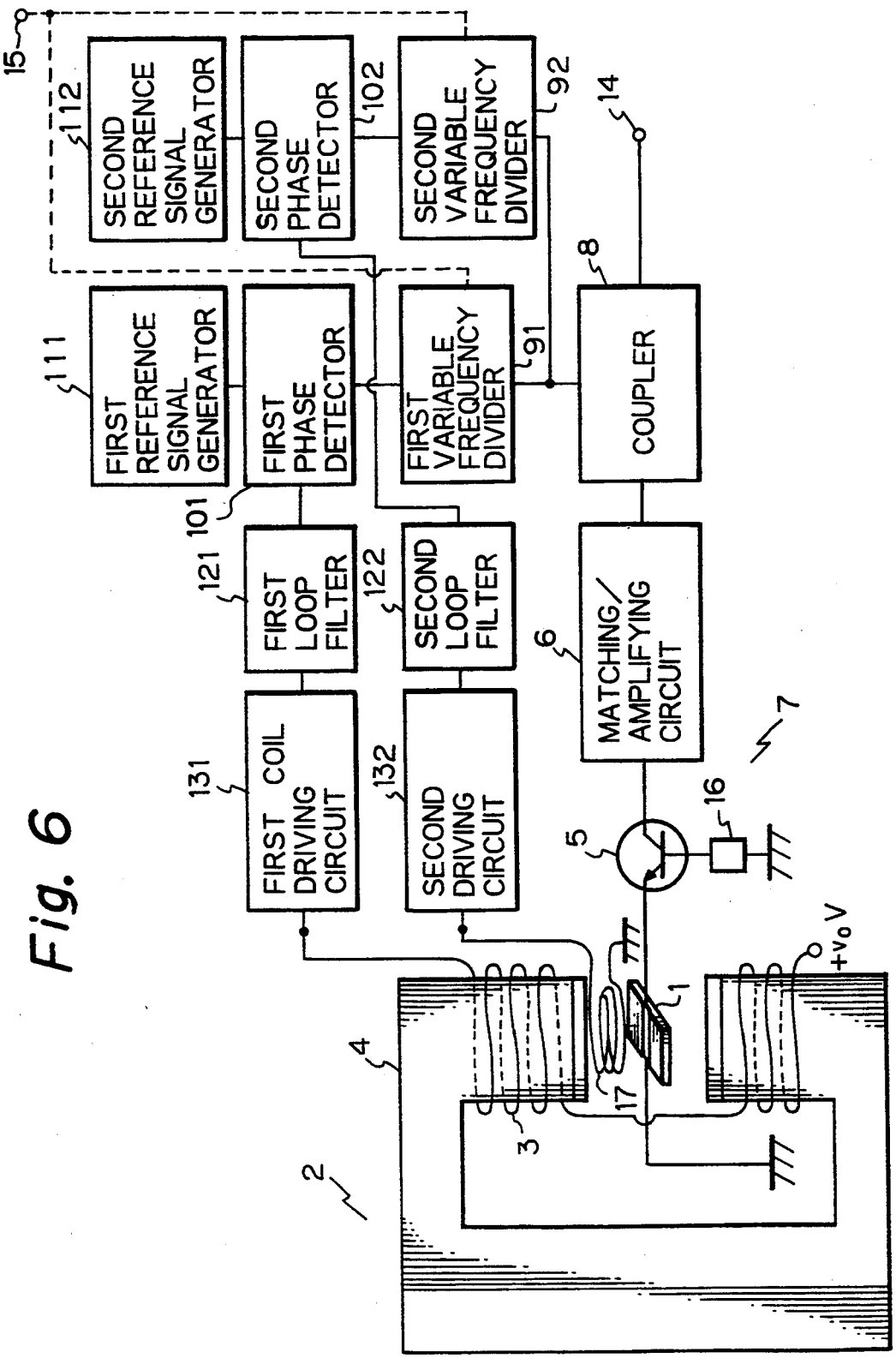
FIG. 6 is a structural block diagram illustrating a frequency synthesizer according to a preferred embodiment of the present invention.

A first preferred embodiment of the present invention will be explained with reference to FIG. 6. The frequency synthesizer according to the first embodiment comprises a magnetic resonator 1 and a magnetic circuit 2 for applying a magnetic field to the magnetic resonator 1. The magnetic circuit comprises a main coil 3, a sub-coil 17 and a yoke 4. The resonator 1 is connected to an active element 5 which is connected to a matching/amplifying circuit 6. The resonator 1, magnetic circuit 2, active element 6 and matching/amplifying circuit 6 form an oscillator 7 which is connected to a coupler 8. An oscillating output can be extracted from an oscillation output terminal 14. Moreover, the active element 5 is connected to a feedback circuit 16.

The frequency synthesizer further includes a first variable frequency divider 91, a second variable frequency divider 92, a first phase detector 101, a second phase detector 102, a first reference signal generator 111, a second reference signal generator 112, a first loop filter 121, a second loop filter 122, a first coil driving circuit 131 and a second coil driving circuit 132. The first and second variable frequency dividers 91 and 92 are connected to a frequency setting input terminal 15.

The first variable frequency divider 1, first phase detector 101, first reference signal generator 111, first loop filter 121 and first coil driving circuit 131 connected between the coupler 8 and main coil 3 from a first control circuit, while the second variable frequency divider 92, second phase detector 102, second reference signal generator 112, second loop filter 122 and the second coil driving circuit 132 connected between the coupler 8 and sub-coil 17 form a second control circuit.

Next, operation will be explained hereunder. The magnetic resonator 1 resonates at a frequency in the microwave or millimeter wave band determined by the magnetic field generated by the magnetic circuit 2. If an electromagnetic wave is amplified each time passes forward and backward between the active element 5 such as a transistor and the magnetic resonator 1, the amplification is contained until the active element 5 is saturated, resulting in oscillation. This oscillating output can be extracted from the output terminal 14 through the matching/amplifying circuit 6 and the coupler 8. Since the frequency of this oscillating output depends on the magnetic field generated by the magnetic circuit 2, the frequency of oscillating output can be stabilized for temperature change and noise by controlling the current flowing through the main coil 3 and sub-coil 17.

When the frequency division ratio "n" of the first variable frequency divider 91 and the frequency division rate "m" of the second variable frequency divider 92 are set through the frequency setting input terminal 15, the frequency $f_1$ of the oscillating output signal extracted by the coupler 8 is divided into $f_1/n$ and $f_1/m$, respectively. Further, when the fixed frequencies $f_2$ and $f_3$ obtained from the first and second reference signal generators 111 and 112 using a crystal-oscillator as an oscillating source are then inputted to the first and second phase detectors 101 and 102, the voltages corresponding to $f_1/n-f_2$ and $f_1/m-f_3$ can be obtained respectively as output voltages of the first and second phase detectors 101 and 102.

This voltage changes with time and include short period changes in voltage caused by noise and long period voltage changes caused by temperature change, which changes are superimposed on each other.

In the first control circuit, a first loop filter 121 operating as a low-frequency band-pass filter has a high cut-off frequency which in order to prevent the short period signal for the sub-coil 17 from entering the main coil 3 and to limit the bandwidth so that only the longer period voltage is allowed to pass through. Even when the number of turns is increased and the inductance is also increased, the main coil 3 can control the fluctuation of low period frequency since the bandwidth of the first loop filter 121 is narrowed. Moreover, in the second control circuit, the second loop filter 122 has a high cut-off frequency higher than the above cut-off frequency of the first loop filter 121 in order to obtain a determined phase noise characteristic and to set the bandwidth so that the signals having the short period dealt with the sub-coil 17 are allowed to pass. Since the first control circuit controls the signal having a wider range and longer period of frequency change and the second control circuit reduces the inductance by reducing the number of turns, the fluctuation of the short period frequency can be controlled by raising the cut-off frequency of the second loop filter 122.

Figure 7:
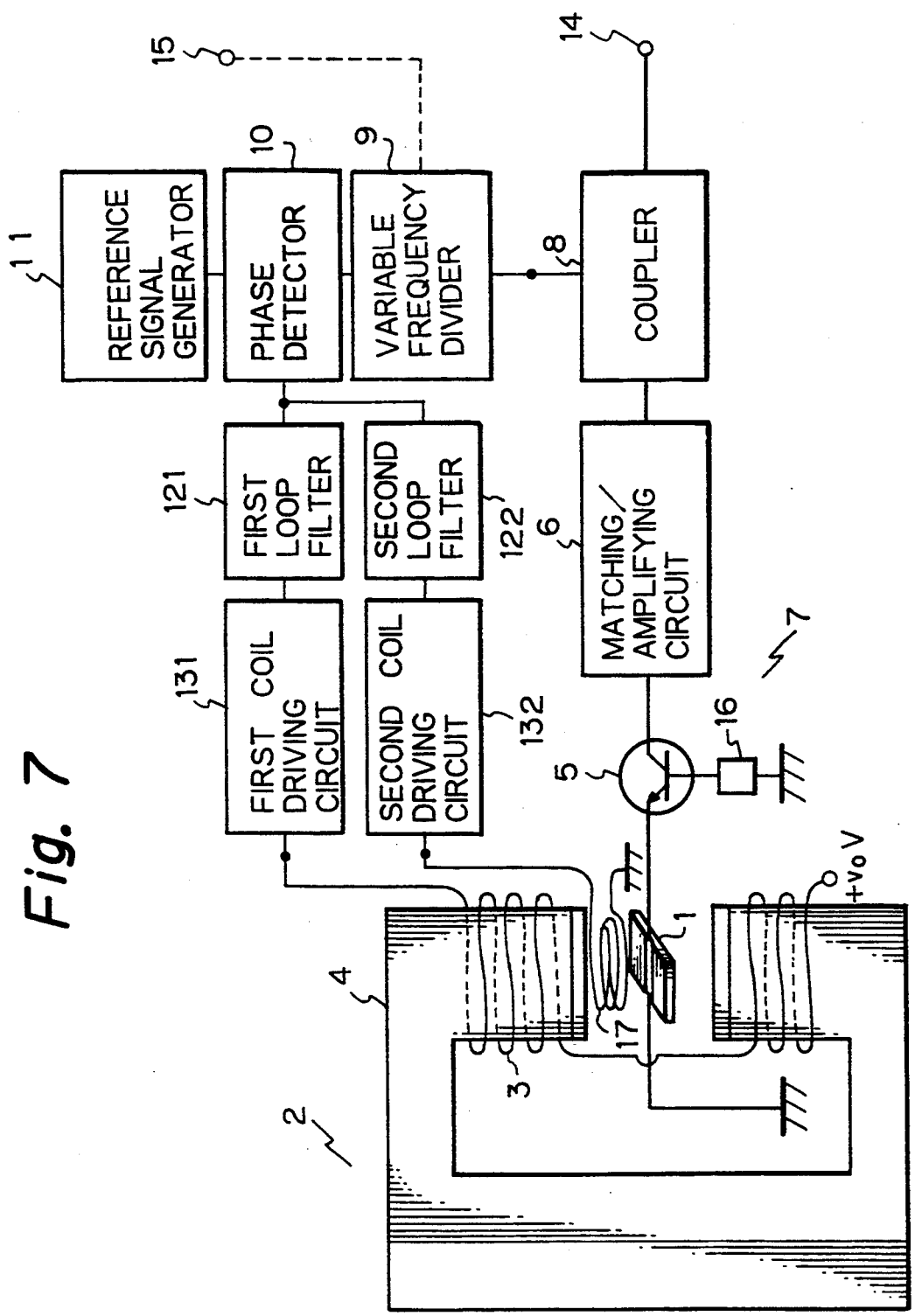
FIG. 7 is a structural block diagram illustrating a frequency synthesizer according to another preferred embodiment of the present invention.

FIG. 7 illustrates a second embodiment of the present invention. The frequency synthesizer according to the second embodiment comprises a magnetic resonator 1 and a magnetic circuit 2 for applying a magnetic field to the magnetic resonator. The magnetic circuit 2 is formed of a main coil 3 and a yoke 4. The resonator 1 is connected to an active element 5, which is then connected to a matching/amplifying circuit 6. The magnetic resonator 1, magnetic circuit 2, active element 5 and matching/amplifying circuit 6 form an oscillator 7. The oscillator 7 is connected to a coupler 8 and an oscillating output can be extracted from an oscillating output terminal 14. Moreover, the active element 5 is connected to a feedback circuit 16.

The frequency synthesizer according to the second embodiment comprises a variable frequency divider 9, a phase detector 10 and a reference signal generator 11 and the variable frequency divider 9 is connected to a frequency setting input terminal 15. In addition, the phase detector 10 is connected to a first loop filter 121 and a second loop filter 122, which are respectively connected to a first coil driving circuit 131 and a second coil driving circuit 132.

The variable frequency divider 9, phase detector 10, reference signal generator 11, first loop filter 211, first coil driving circuit 131 connected between the coupler 8 and the main coil 3 form a first control circuit, while the variable frequency divider 9, phase detector 10, reference signal generator 11, second loop filter 122 and second coil driving circuit 132 connected between the coupler 8 and sub-coil 17 form a second control circuit. The second embodiment is different from the first embodiment in the structure that the variable frequency divider 9, phase detector 10 and reference signal generator 11 are used in common in the first and second control circuits.

Operation of the second embodiment will be explained hereunder. The magnetic resonator 1 resonates at a frequency in the microwave or millimeter wave band determined by the magnetic field generated by the magnetic circuit 2. If an electromagnetic wave is amplified each time it goes forward and backward between the active element 5 such as a transistor and the magnetic resonator 1, amplification is repeated until the active element 5 is saturated, resulting in oscillation. This oscillation output can be extracted from the output terminal through the matching/amplifying circuit 6 and coupler 8. Since the frequency of this oscillation output depends on the magnetic field generated by the magnetic circuit 2, the frequency of oscillation output can be stabilized for change of temperature and noise by controlling the current through the main coil 3 and sub-coil 17.

When the frequency division ratio "n" of the variable frequency divider 9 is set through the frequency setting input terminal 15, the frequency $f_1$ of the oscillating output signal extracted by the coupler 8 is divided into $f_1/n$ and the fixed frequency $f_2$ obtained from the reference signal generator 11 using a crystal oscillator as an oscillating source is inputted to the phase detector 10, a voltage corresponding to $f_1/n-f_2$ is obtained as the output of the phase detector 10. This voltage changes with time and includes short period changes in voltage caused by noise and long period changes in voltage caused by temperature change, which changes are superimposed on each other.

In the first control circuit, the first loop filter 121 operating as a low frequency band-pass filter has a narrow bandwidth so that only a voltage having a long period can pass therethrough. Even when the main coil 3 has the large number of windings or turns to have a large inductance, the fluctuation of the lower frequency can be reduced since the first loop filter 121 has a narrow bandwidth. Moreover, in the second control circuit, the second loop filter 122 has a wide bandwidth so that a voltage of a short period also can pass therethrough. The first control circuit can control long period changes in voltage which occur in the wider frequency range and the second control circuit includes the second loop filter 12 having a relatively wide bandwidth thereby controls short period variations in the frequency since the sub-coil 17 has a reduced number of windings thereof to reduce the inductance.

Figure 8:
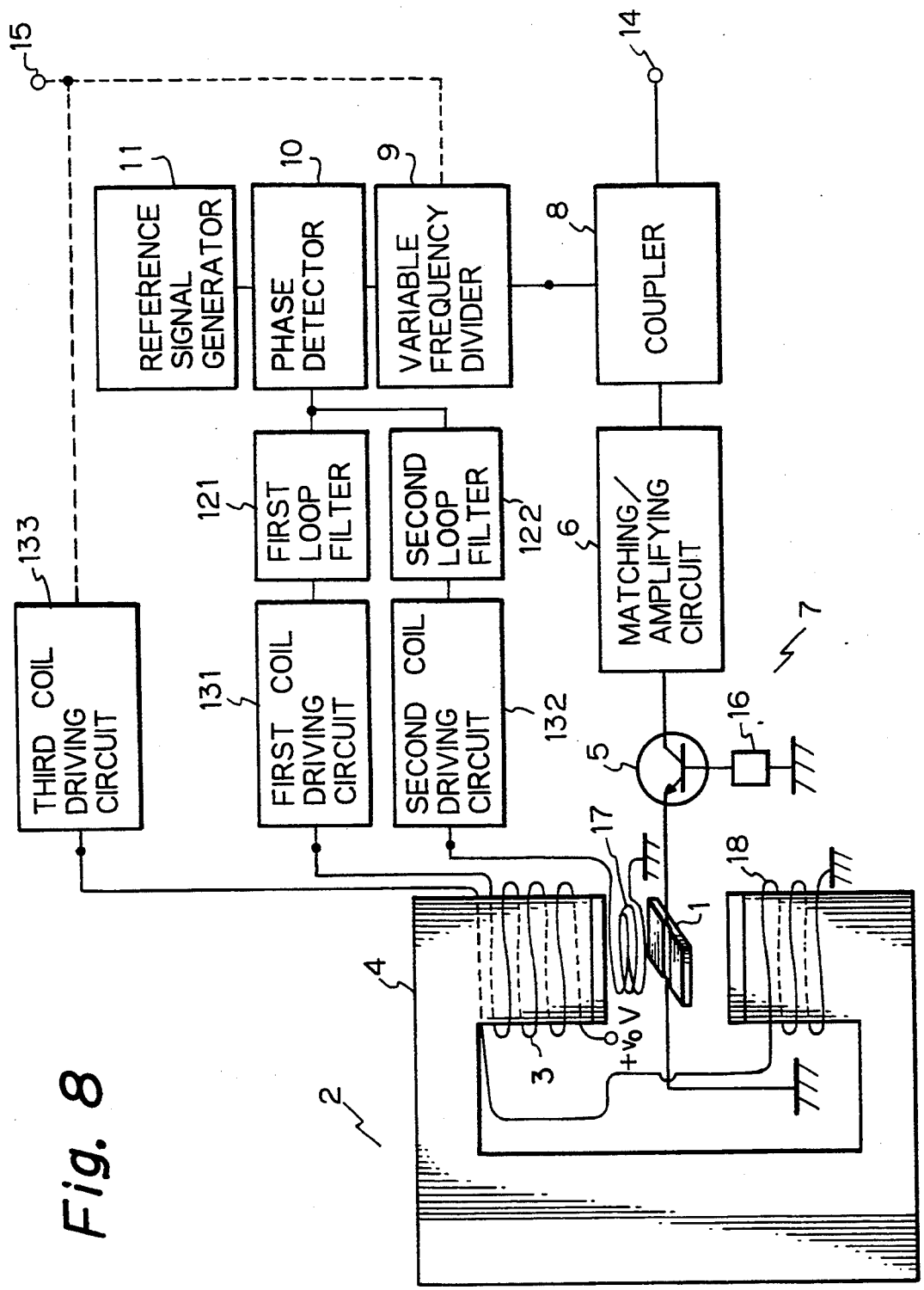
FIG. 8 is a structural block diagram illustrating a frequency synthesizer according to another preferred embodiment of the present invention.

FIG. 8 illustrates a third embodiment of the present invention. The frequency synthesizer of the third embodiment is different from the second embodiment in that the main coil is divided into two sections and a third coil driving circuit 133 is used. The third embodiment comprises a magnetic resonator 1 and a magnetic circuit 2. The magnetic circuit 2 is formed of a first main coil 3, a second main coil 18, a sub-coil 17 and a yoke 4. The resonator 1 is connected to an active element 5 which is then connected to a matching or amplifying circuit 6. The magnetic resonator 1, magnetic circuit 2, active element 5 and matching/amplifying circuit 6 form an oscillator 7. The oscillator 7 is connected to the coupler 8 and an oscillating output can be extracted from an oscillating output terminal 14. Moreover, the active element 5 is connected to a feedback circuit 16.

A variable frequency divider 9, a phase detector 10, a reference signal generator 11, a first loop filter 121 and a first coil driving circuit 131 connected between the coupler 8 and the first main coil 3 form a first control circuit, while the variable frequency divider 9, phase detector 10, reference signal generator 11, a second loop filter 122 and a second coil driving circuit 132 connected between the coupler 8 and sub-coil 17 form a second control circuit. In the first and second control circuits, the variable frequency divider 9, phase detector 10 and reference signal generator 11 are used in common. Moreover, the second main coil 18 is connected to a third coil driving circuit 13 to form a third control circuit.

Operation will then be explained. The magnetic resonator 1 resonates at a frequency of the microwave or millimeter wave band which is determined by the magnetic field determined by the magnetic circuit 2. If an electromagnetic wave is amplified each time when it goes forward and backward between the active element 5 such as transistor and the magnetic resonator 1, amplification is repeated until the active element 5 is saturated, resulting in oscillation. This oscillating output can be extracted from an output terminal through the matching or amplifying circuit 6 and the coupler 8. Since the frequency of this oscillating output depends on the magnetic field generated by the magnetic circuit 2, the frequency of the oscillating output can be stabilized for change of temperature and noise by controlling the current flowing through the first main coil 3, second main coil 18 and sub-coil 17.

When the frequency division ratio "n" of the variable frequency divider is set through the frequency setting input terminal 15, the frequency $f_1$ of the oscillating output signal extracted by the coupler 8 is divided into $f_1/n$ and the fixed frequency $f_2$ obtained from the reference signal generator 11 using a crystal oscillator as an oscillating source is inputted to the phase detector 10, a voltage corresponding to $f_1/n - f_2$ can be obtained as an output voltage from the phase detector 10. This voltage changes with time and includes short period changes in voltage caused by noise and long period changes in voltage caused by temperature change, which changes are superimposed on each other.

In the first control circuit, the first loop filter 121 operating as a low frequency band-pass filter has a high cut-off frequency for preventing the signal of short period used for the sub-coil 17 from entering the first main coil, while in the second control circuit, the second loop filter 122 has a high cut-off frequency higher than the above cut-off frequency of the first loop filter 121 in order to realize a predetermined phase noise characteristic, and has the bandwidth to allow even the short period signal to be used for the sub-coil 17 to pass therethrough. In the third control circuit, the third coil driving circuit 13 provides the second main coil 18 with a DC current which produces a frequency approximate to a desired frequency depending on the preset frequency given through the frequency setting input terminal 15. The desired frequency is obtained by adjusting the magnetic field produced by the main coil 3. Therefore, the first main coil 3 can reduce the phase difference between an output voltage of the first loop filter 121 and the coil current of the first main coil 3 by reducing the number of turns thereof more than the second main coil 18 to obtain a small inductance. Accordingly, the first control circuit can control the fluctuation of the long period, while the second control circuit can control the short period fluctuation with higher accuracy.

Figure 9:
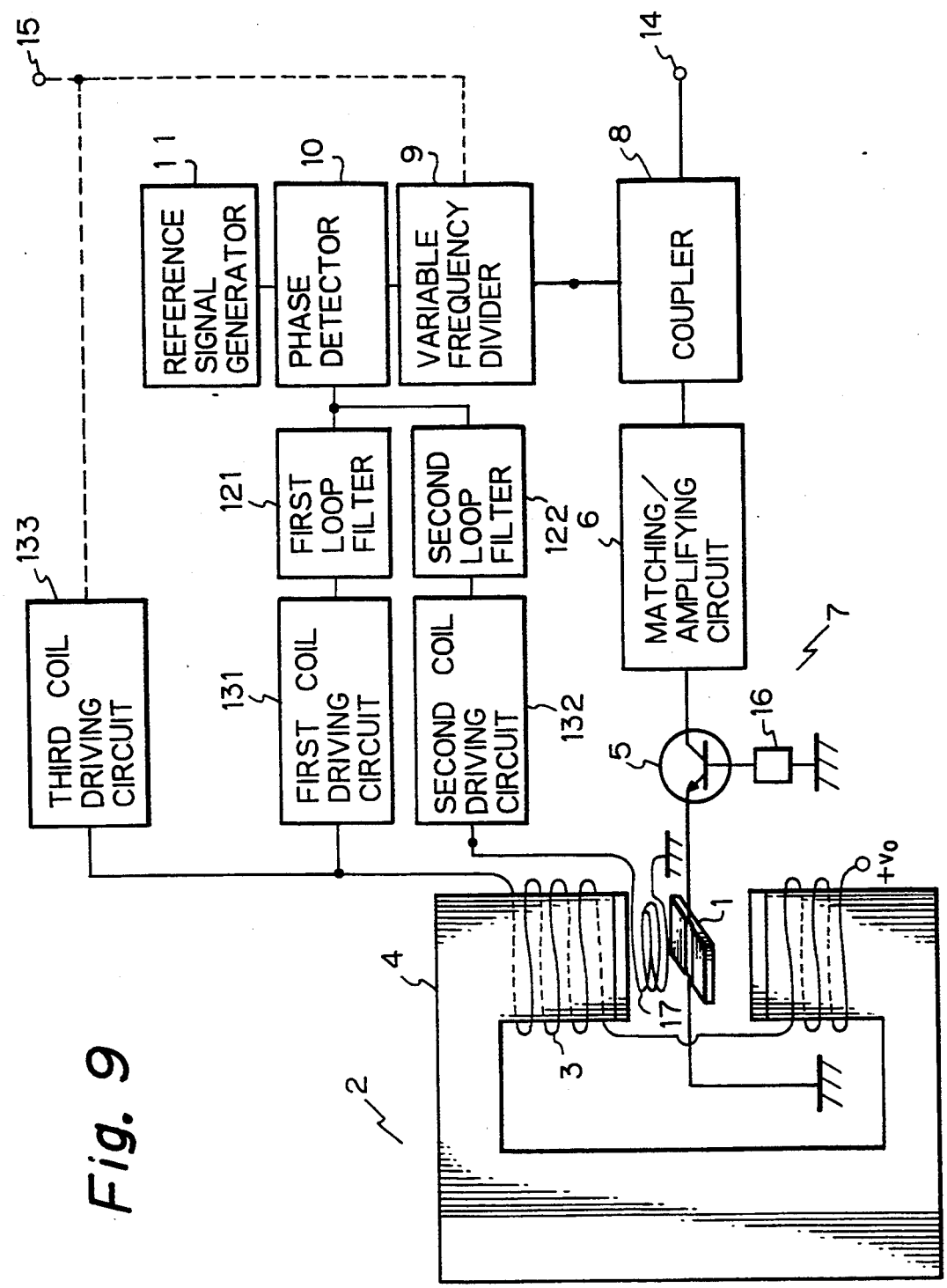
FIG. 9 is a structural block diagram illustrating a frequency synthesizer according to another preferred embodiment of the present invention.

FIG. 9 illustrates a fourth embodiment of the present invention. In the frequency synthesizer of the fourth embodiment, a main coil 3 is not divided into two sections, but a third coil driving circuit 133 is provided and outputs of the first and third coil driving circuits are supplied to the main coil 3.

As illustrated in FIG. 9, the frequency synthesizer of the fourth embodiment of the present invention comprises a magnetic resonator 1 and a magnetic circuit for applying a magnetic field to the magnetic resonator 1. The magnetic circuit 2 includes a main coil 3, a sub-coil 17 and a yoke 4. The resonator 1 is connected to an active element 5 which is connected to a matching/amplifying circuit 6. The magnetic resonator 1, magnetic circuit 2, active element 5 and matching/amplifying circuit 6 form an oscillator 7. This oscillator 7 is connected to a coupler 8 and an oscillating output can be extracted from an oscillating output terminal 14. Moreover, the active element 5 is connected to a feedback circuit 16.

A variable frequency divider 9, a phase detector 10, a reference signal generator 11, a first loop filter 121 and a first coil driving circuit 131 connected between the coupler 8 and the main coil 3 form a first control circuit, while the variable frequency divider 9, phase detector 10, reference signal generator 11, a second loop filter 122 and a second coil driving circuit 132 connected between the coupler 8 and sub-coil 17 form a second control circuit. In the first and second control circuits, the variable frequency divider 9, phase detector 10, reference signal generator 11 are used in common. Moreover, the main coil 3 is connected to a third coil driving circuit 13 to form a third control circuit.

Operation of the fourth embodiment will be explained hereunder. The magnetic resonator 1 resonates at a frequency of the microwave or millimeter wave band determined by the magnetic field generated by the magnetic circuit 2. If an electromagnetic wave is amplified each time when it goes forward and backward between the active element 5 such as transistor and the magnetic resonator 1, amplification is repeated until the active element 5 is saturated, resulting in oscillation. This oscillating output can be extracted from the output terminal 14 through the matching/amplifying circuit; 6 and the coupler 8. Since the frequency of this oscillating output depends on the magnetic field generated by the magnetic circuit 2, the frequency of oscillating output can be stabilized for temperature change and noise by controlling the current flowing through the main coil 3 and sub-coil 17.

When the frequency division ratio "n" of the variable frequency divider 9 is set through the frequency setting input terminal 15, the frequency $f_1$ of the oscillating output signal extracted by the coupler 8 is divided into $f_1/n$ and the fixed frequency $f_2$ obtained from the reference signal generator 11 using a crystal oscillator as an oscillating source is inputted to the phase detector 10, a voltage corresponding to $f_1/n - f_2$ can be obtained as an output voltage of the phase detector 10. This voltage changes with time and includes short period changes in voltage caused by noise and long period voltage changes caused by temperature change, which changes are superimposed on each other.

In the first control circuit, the first loop filter 121 operating as a low frequency band-pass filter has a narrow bandwidth so that the voltage passing therethrough is limited to only the voltage of long period. Even when the main coil 3 has the increased number of turns to obtain a large inductance, since the first loop filter 121 has the narrow bandwidth, the fluctuation of a low frequency can be reduced. Moreover, in the second control circuit, the second loop filter 122 has a wide bandwidth so that even a voltage of short period can pass therethrough. Since the first control circuit controls the frequency change in wider range with long period and the second control circuit has the reduced number of turns of the sub-coil 17 to make small the inductance thereof, the fluctuation of the short period frequency can be controlled by widening the bandwidth of the second loop filter 12. In the third control circuit, the third coil driving circuit 133 provides the main coil 3 with a DC current which produces an approximately desired frequency. The desired frequency is obtained by adjusting the magnetic field on the basis of the preset frequency given through the frequency setting input terminal 15. The DC current and the output current from the first control circuit flow through the coil 3. Therefore, the first control circuit controls the long period fluctuation frequency, while the second control circuit controls the short period fluctuation frequency and the third control circuit sets the nearly desired frequency.

Figure 10:
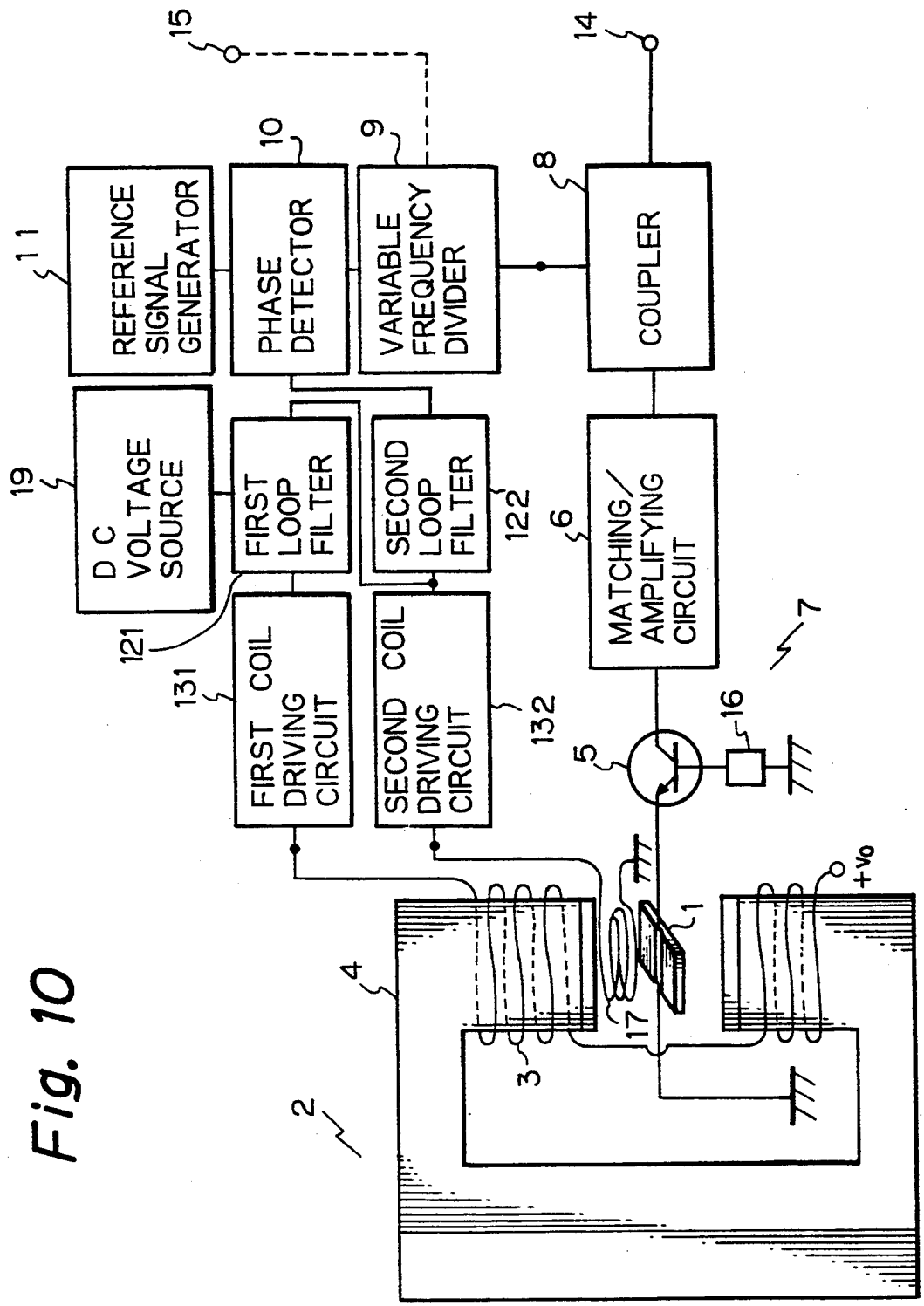
FIG. 10 is a structural block diagram illustrating a frequency synthesizer according to another preferred embodiment of the present invention.

FIG. 10 illustrates a fifth embodiment of the present invention. This embodiment resembles the second embodiment illustrated in FIG. 7, but the first loop filter 121 is not connected to the phase detector 10 but to the second loop filter 122 and a DC voltage source 19.

As shown in FIG. 10, the frequency synthesizer of the fifth embodiment of the present invention comprises a magnetic resonator 1 and a magnetic circuit 2 for applying a magnetic field to the magnetic resonator 1. The magnetic circuit 2 includes a main coil 3, a sub-coil 17 and a yoke 4.

The resonator 1 is connected to an active element 5 which is connected to a matching/amplifying circuit 6. The magnetic resonator 1, magnetic circuit 2, active element 5 and matching/amplifying circuit 6 form an oscillator 7. The oscillator 7 is connected to a coupler 8 and an oscillating output can be extracted from an oscillating output terminal 14. Moreover, the active element 5 is connected to a feedback circuit 16.

A variable frequency divider 9, a phase detector 10, a reference signal generator 11, a second loop filter 122, a first loop filter 121, a second coil driving circuit 131 connected between the coupler 8 and main coil 3 for a first control circuit, while the frequency divider 9, phase detector 10, reference signal generator 11, second loop filter 122, second coil driving circuit 132 connected between the coupler 8 and sub-coil 17 form a second control circuit. In both first and second control circuits, the second loop filter 122, variable frequency divider 9, phase detector 10 and the reference signal generator 11 are used in common.

Figure 11:
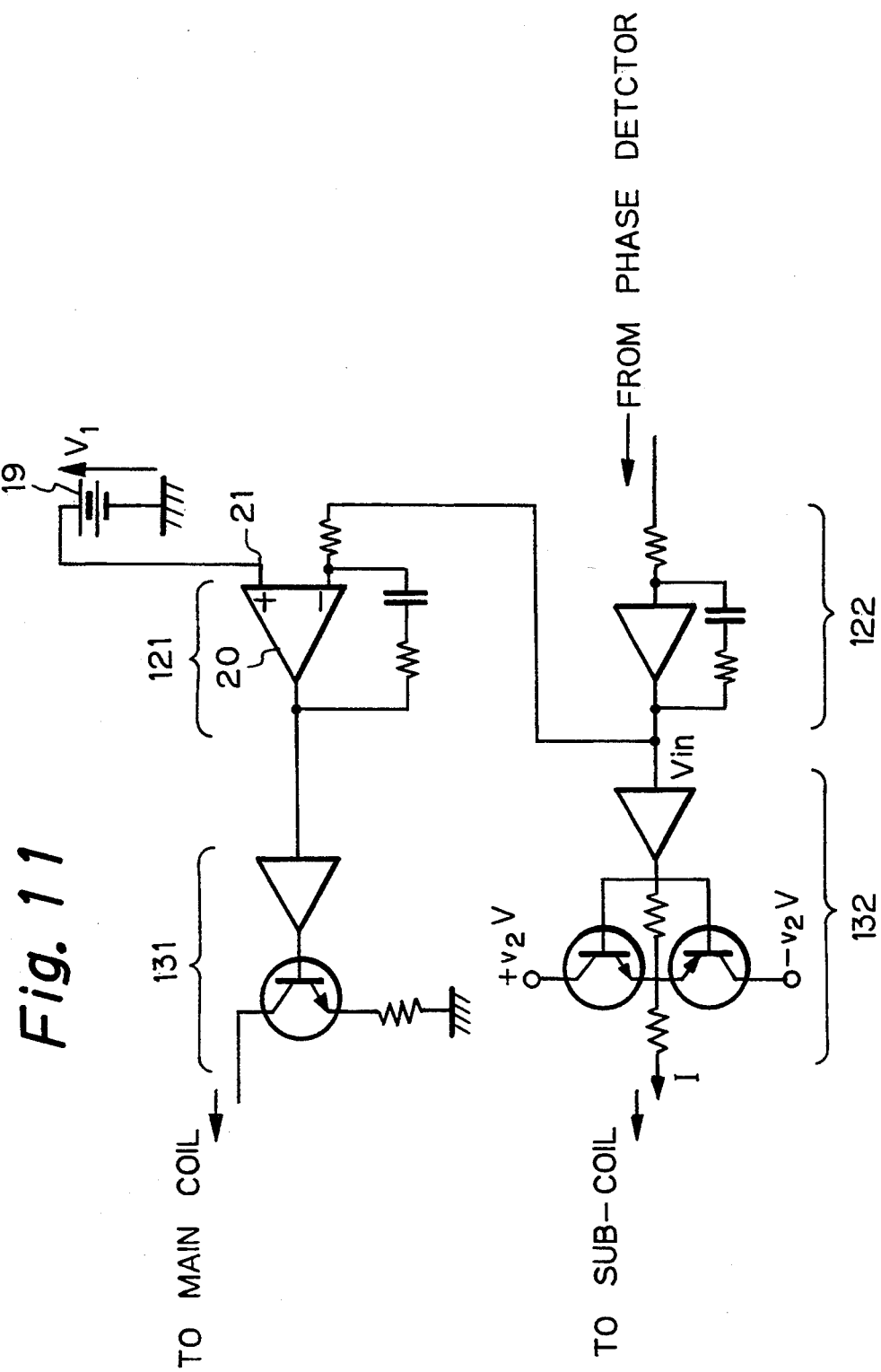
FIG. 11 illustrates detailed circuit diagram of the first and second loop filters and the first and second coil driving circuits shown in FIG. 10.

FIG. 11 illustrates details of the circuits of DC voltage source 19, first and second loop filters 121, 122 and first and second coil driving circuits 131, 132 shown in FIG. 10. As illustrated in FIG. 11, the DC voltage source 19 is connected to an input terminal 21 of an operational amplifier 20 forming the first loop filter 121.

Operation of this fifth embodiment will then be explained hereunder. The magnetic resonator 1 resonates at a frequency of the microwave or millimeter wave band which is determined by the magnetic field generated by the magnetic circuit 2. If an electromagnetic wave is amplified each time when it goes forward and backward between the active element 5 such as transistor and magnetic resonator 1, amplification is repeated until the active element 5 is saturated, resulting in oscillation. This oscillating output can be extracted from the output terminal through the matching/amplifying circuit 6 and the coupler 8. Since the frequency of this oscillating output depends on the magnetic field generated by the magnetic circuit 2, the frequency of the oscillating output can be stabilized for temperature change and noise by controlling the current of the main coil 3 and sub-coil 17.

When the frequency division ratio "n" of the variable frequency divider 9 is set through frequency setting input terminal 15, the frequency $f_1$ of the oscillating output signal extracted from the coupler 8 is divided into $f_1/n$ and the fixed frequency $f_2$ obtained from the reference signal generator 11 using a crystal oscillator as an oscillating source is then inputted to the phase detector 10, a voltage corresponding to $f_1/n - f_2$ can be obtained as an output of the phase detector 10. This voltage changes with time and includes short period changes in voltage caused by noise and long period voltage changes caused by temperature change, which changes are superimposed on each other.

Figure 12:
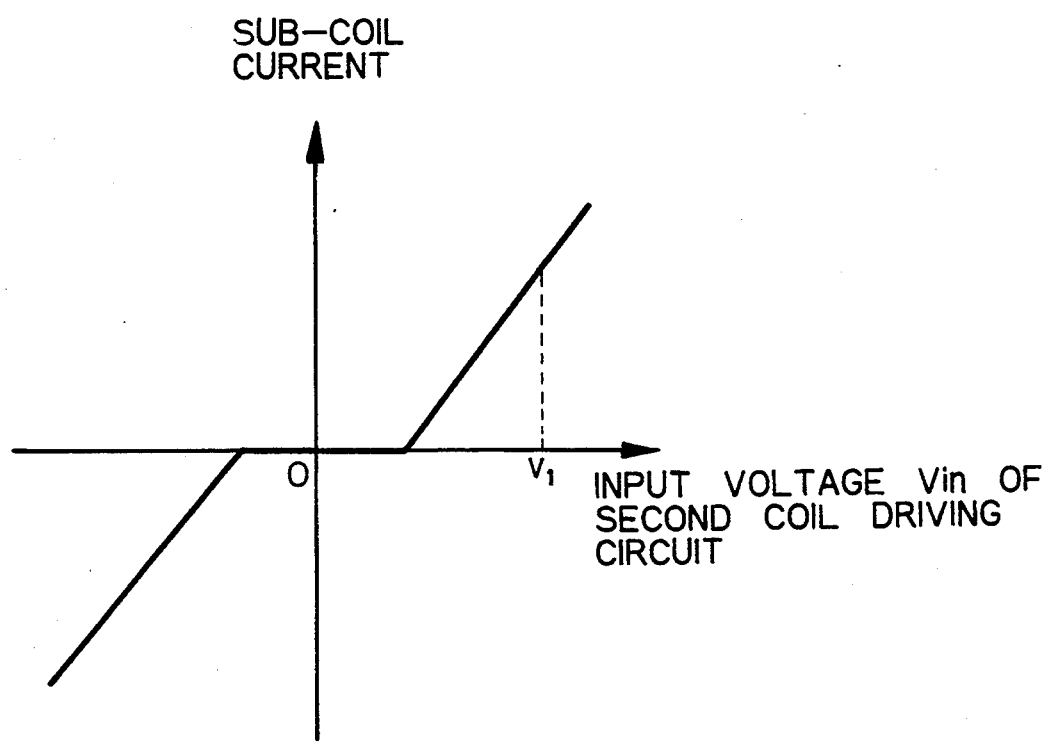
FIG. 12 is a graph illustrating a sub-coil current characteristic for explaining the embodiment shown in FIG. 10.

In the first control circuit, when the pass-band width of the second loop filter 122 operating as a low frequency band-pass filter is set wider and the pass-band width of the first loop filter 121 is set narrower, the range of the controllable frequency fluctuation is mainly determined by the first loop filter 121 and limited to only the frequency of long period. Since a voltage v1 other then 0 V is applied as a comparison voltage to the operational amplifier 20 forming the first loop filter 121 by the DC voltage source 19, an output voltage of the second loop filter 122 reaches a value near the voltage v1 when an approximately phase synchronized condition is obtained, that is, $f_1/n - f_2$ becomes almost 0. For instance, in such a case that the second coil driving circuit 132 is formed as a push-pull type as shown in FIG. 11 to give a positive or negative current to the sub-coil 17, the dead-band is sometimes generated when an input voltage $V_{in}$ of the second coil driving circuit 132 becomes almost 0 [V] as shown in FIG. 12, but such input voltage becomes v1 [V] under the phase synchronized condition, avoiding the occurrence of the dead band. Thereby, not only the long period fluctuation in frequency but also the short period fluctuation in frequency can be controlled continuously.

In the above embodiments, use of magnetic film resonator is disclosed, but a magnetic spherical resonator can also be used to provide meritorious effects similar to those of the above embodiment.

Moreover, in the above embodiments, only a yoke is used in the magnetic circuit, but the combination of a permanent magnet for bias and the yoke is also possible for the magnetic circuit to provide meritorious effects similar to those of the above embodiments.

Figure 13:
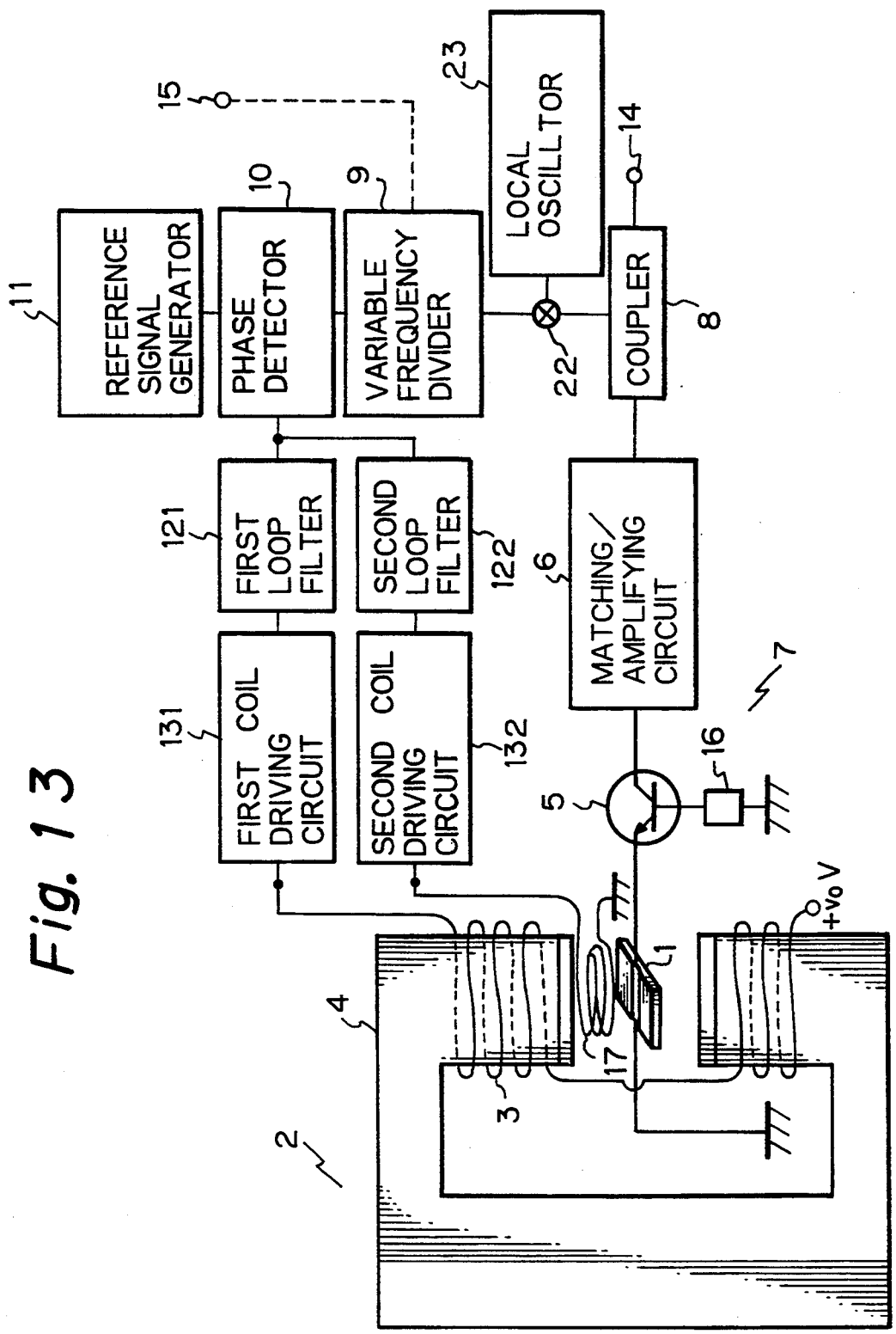
FIG. 13 is a structural block diagram illustrating a frequency synthesizer according to another preferred embodiment of the present invention.

In addition, the direct frequency dividing system is introduced in the above embodiments in which the signal extracted through the coupler is directly applied to the variable frequency divider, but as shown in FIG. 13, it is also possible to employ other structures such as a heterodyne system where the mixer 22 is connected to the local oscillator 23.

Figure 14:
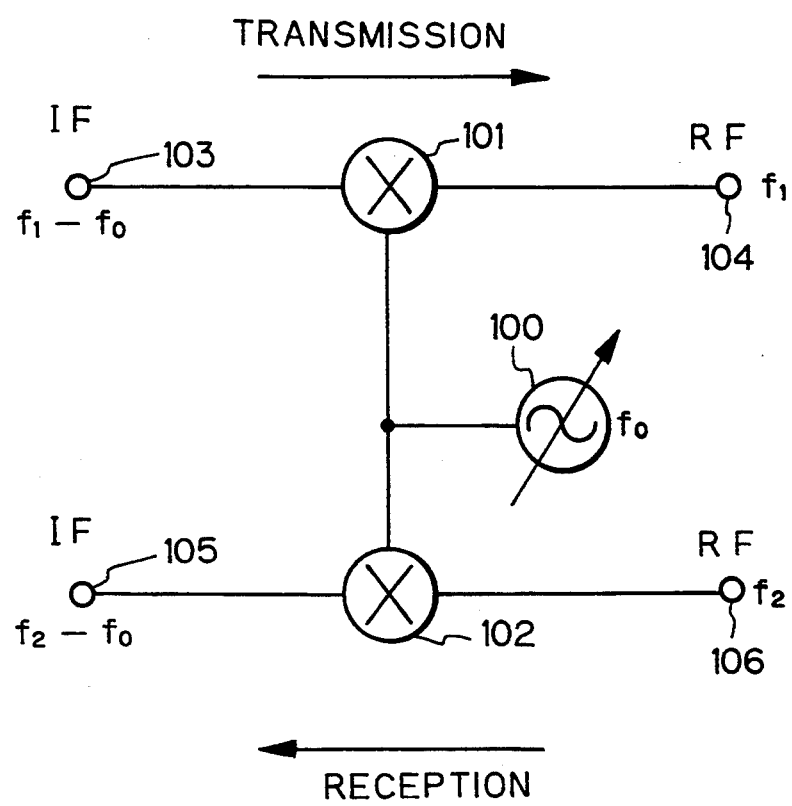
FIG. 14 is a schematic diagram illustrating an application example of a frequency synthesizer of the present invention.

Next, application examples of the frequency synthesizer of the present invention will be explained. FIG. 14 is a simplified diagram of a microwave transmission/reception system provided in a ground station for satellite communication. A frequency synthesizer is used as a local oscillator 100 in FIG. 14. In the satellite communication system, different frequencies are generally used for the communication path from the ground station to the satellite and the path from the satellite to the ground station.

The intermediate frequency (IF) signal having the frequency $f_1 - f_0$ applied to a terminal 103 is mixed by a mixer 101 with the signal of frequency $f_o$ from the frequency synthesizer 100 and is then up-converted to a radio frequency (RF) signal before it is outputted from a terminal 104. This radio frequency signal from the terminal 104 is transmitted to the satellite (not illustrated) through an antenna (not illustrated).

The radio frequency signal from the satellite having the frequency $f_2$ is supplied to a terminal 106, which is mixed in the mixer 102 with the signal from the frequency synthesizer 100 and is then down-converted to the frequency $f_2 - f_0$. Thus, the intermediate frequency signal is supplied to a terminal 105.

Figure 1:
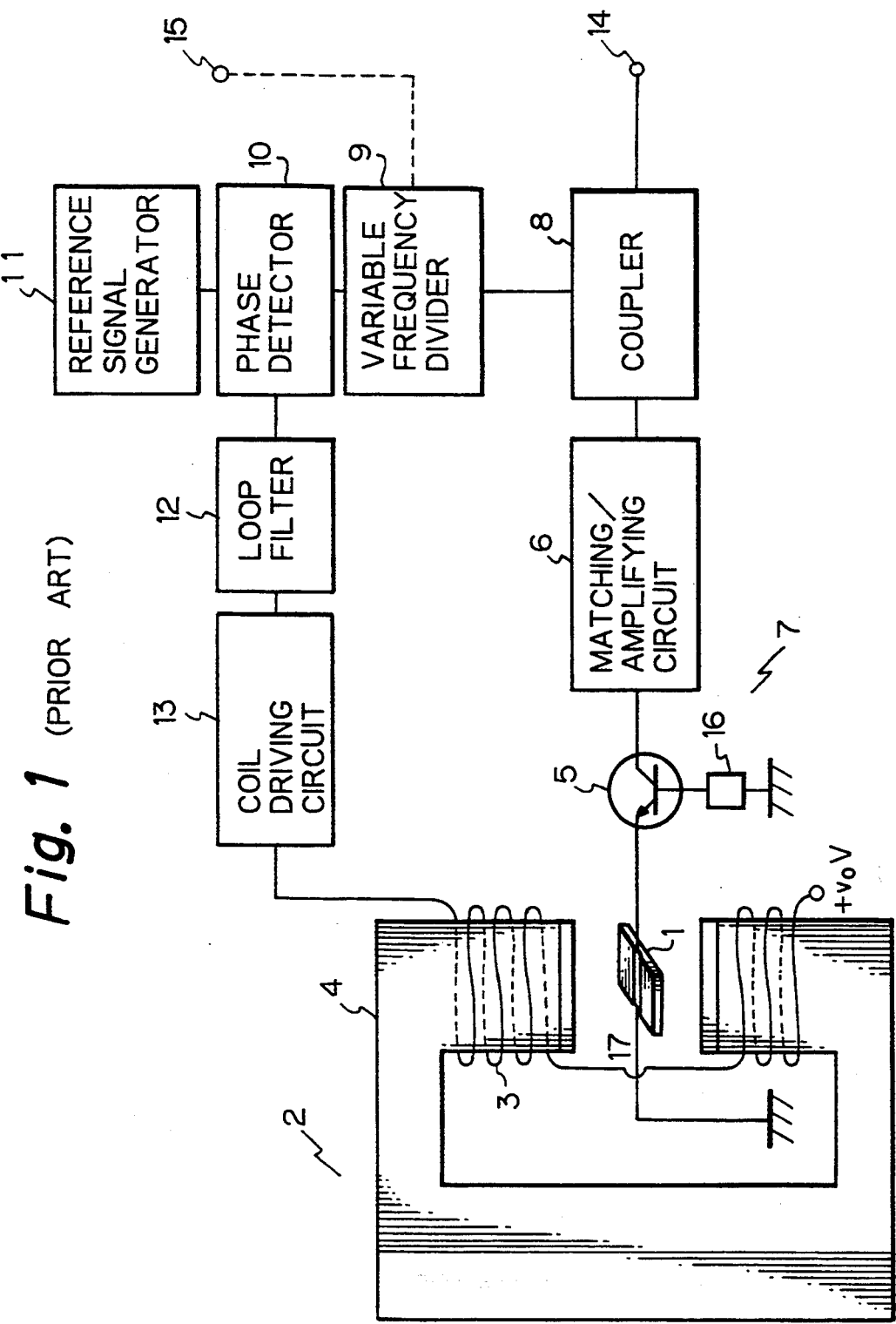
FIG. 1 is a structural block diagram illustrating a frequency synthesizer of the prior art.
Figure 2:
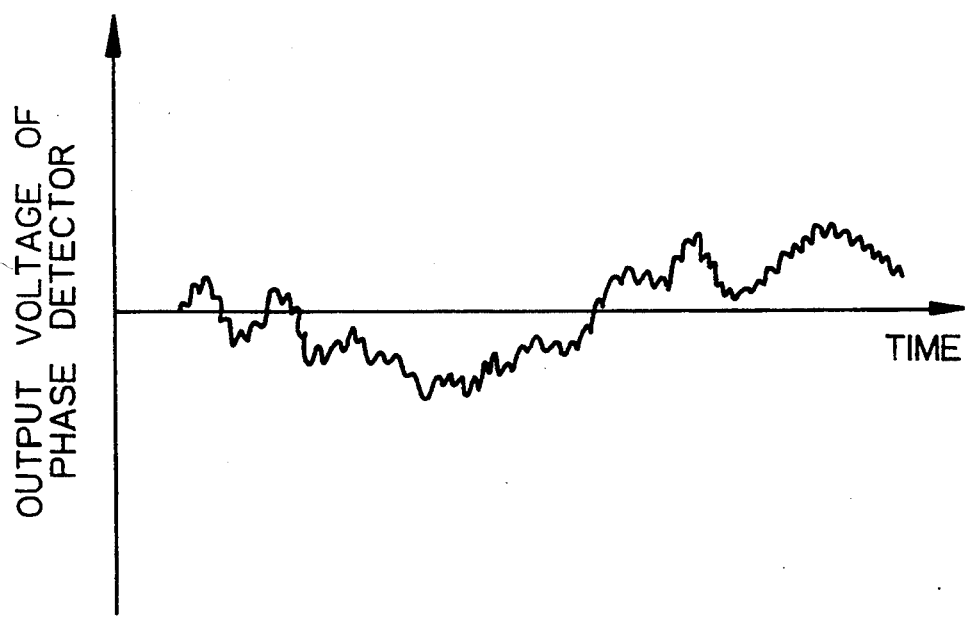
FIG. 2 is a graph illustrating an output example of a phase detector without phase synchronization.
Figure 3:
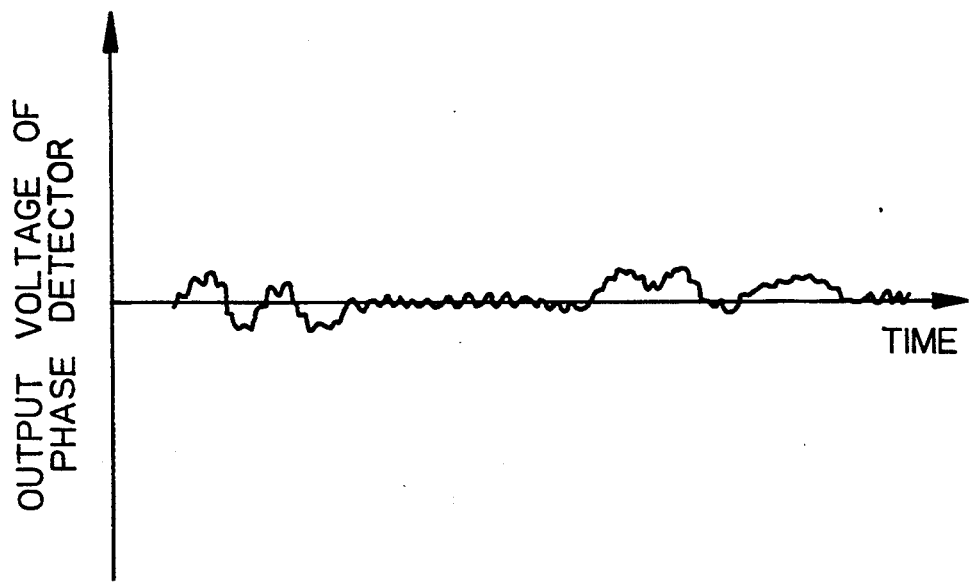
FIG. 3 is a graph illustrating an output example of a phase detector with phase synchronization in a frequency synthesizer of the prior art.
Figure 4:
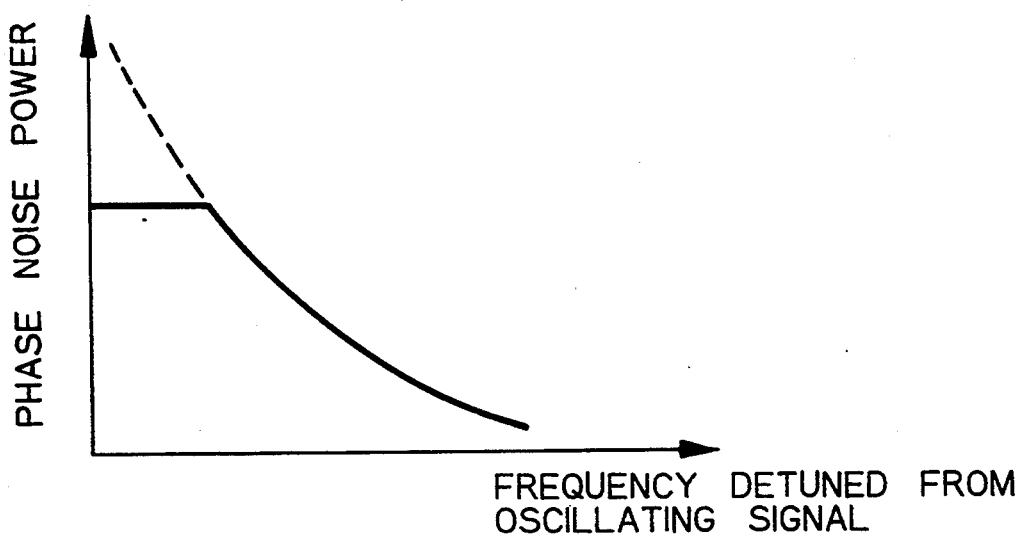
FIG. 4 is a graph illustrating a phase noise characteristic example in a frequency synthesizer of the prior art.
Figure 5:
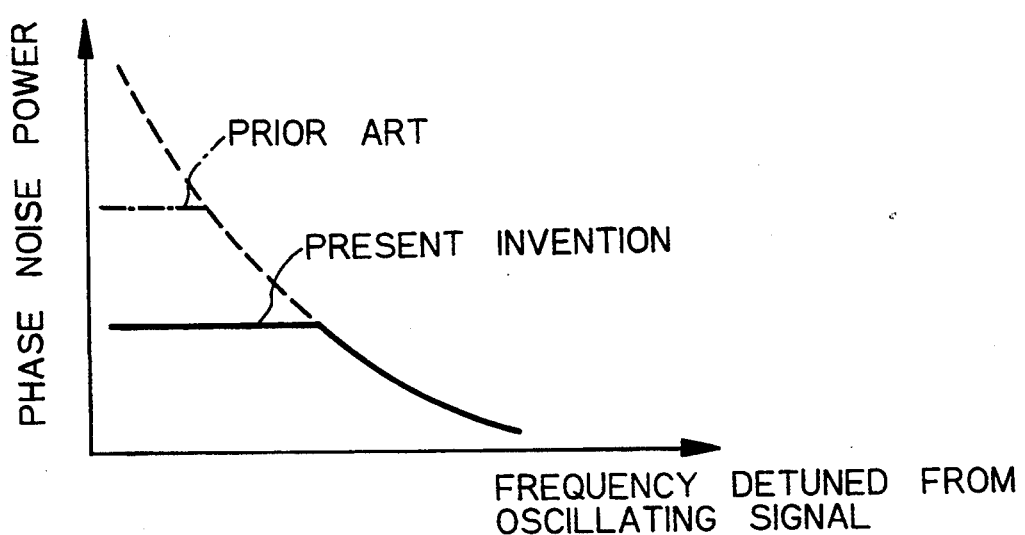
FIG. 5 is a graph illustrating a phase noise characteristic example in a frequency synthesizer according to a preferred embodiment of the present invention.

Since the frequency synthesizer 100 of the present invention can supply an oscillating frequency which ensures a wide frequency control range and is stabilized as shown in FIG. 5 even for temperature change and noise, this frequency synthesizer realizes excellent satellite communication.

What is claimed is:

1. A frequency synthesizer for stabilizing an oscillating frequency of an oscillator comprising: a magnetic resonator; a magnetic circuit for applying a magnetic field to said magnetic resonator; a control system for controlling a driving current of said magnetic circuit on the basis of the oscillating frequency of the oscillator having said magnetic resonator; said magnetic circuit including a long period signal control coil and a short period signal control coil for applying a predetermined magnetic field to said magnetic resonator; a long period signal control coil control system for controlling a driving current of said long period signal control coil on the basis of the oscillating frequency of said oscillator; a short period signal control coil control system for controlling a driving current of said short period signal control coil; a first filter included in said long period signal control coil control system, said first filter having a high cut off frequency for blocking the flow of a short period signal for said short period signal control coil to said long period signal control coil; and, a second filter included in said short period signal control coil control system, said second filter having a high cut-off frequency higher than the cut-off frequency of said first filter to realize a predetermined phase noise characteristic, whereby driving currents of said long period signal control coil and said short period signal control coil are controlled.

2. A frequency synthesizer for stabilizing an oscillating frequency of an oscillator comprising: a magnetic resonator; a magnetic circuit for applying a magnetic field to said magnetic resonator; a control system for controlling a driving current of said magnetic circuit on the basis of the oscillating frequency of the oscillator having said magnetic resonator; said magnetic circuit, for applying a predetermined magnetic field to said magnetic resonator, including a bias coil, a long period signal control coil and a short period signal control coil having inductances smaller than that of the bias coil; a bias coil control system for controlling a DC driving current of said bias coil on the basis of a frequency setting signal; a long period signal control coil control system for controlling a driving current of said long period signal control coil on the basis of the oscillating frequency of said oscillator; a short period signal control coil control system for controlling a driving current of said short period signal control coil; a first filter included in said long period signal control coil control system, said first filter having a high cut off frequency for blocking the flow of a short period signal for said short period signal control coil to said long period signal control coil; and, a second filter included in said short period signal control coil control system, said second filter having a high cut-off frequency higher than the cut-off frequency of said first filter to realize a predetermined phase noise characteristic, thereby allowing the DC driving current to flow through said bias coil to cause said oscillator having magnetic resonator to oscillate at a predetermined oscillating frequency and thereby controlling the driving currents of said long period signal control coil and short period signal control coil.

3. A frequency synthesizer for stabilizing an oscillating frequency of an oscillator comprising: a magnetic resonator; a magnetic circuit for applying a magnetic field to said magnetic resonator; a control system for controlling a driving current of said magnetic circuit on the basis of the oscillating frequency of the oscillator having said magnetic resonator; said magnetic circuit including a long period signal control coil and a short period signal control coil for applying a predetermined magnetic field to said magnetic resonator; a bias coil control system for controlling a DC driving current of said long period signal control coil on the basis of a frequency setting signal; a long period signal control coil control system for controlling a driving current of said long period signal control coil on the basis of the oscillating frequency of said oscillator; a short period signal control coil control system for controlling a driving current of said short period signal control coil; a first filter included in said long period signal control coil control system, said first filter having a high cut off frequency for blocking the flow of a short period signal for said short period signal control coil to said long period signal control coil; and, a second filter included in said short period signal control coil control system, said second filter having a high cut-off frequency higher than the cut-off frequency of said first filter to realize a predetermined phase noise characteristic, whereby the driving current of said long period signal control coil control system is supplied to said long period signal control coil in addition to the DC driving current for causing said oscillator having said magnetic resonator to oscillate at a predetermined oscillating frequency and the driving currents of said long period signal control coil and the short period signal control coil are controlled.

4. A frequency synthesizer for stabilizing an oscillating frequency of an oscillator comprising: a magnetic resonator; a magnetic circuit for applying a magnetic field to said magnetic resonator; a control system for controlling a driving current of said magnetic circuit on the basis of the oscillating frequency of the oscillator having said magnetic resonator; said magnetic circuit including at least long period signal control coil and a short period signal control coil for applying a predetermined magnetic field to said magnetic resonator; a long period signal control coil control system for controlling a driving current of said long period signal control coil on the basis of the oscillating frequency of said oscillator; a short period signal control coil control system for controlling a driving current of said short period signal control coil; a first filter included in said long period signal control coil control system, said first filter having a high cut off frequency for blocking the flow of a short period signal for said short period signal control coil to said long period signal control coil; and, a second filter included in said short period signal control coil control system, said second filter having a high cut-off frequency higher than the cut-off frequency of said first filter to realize a predetermined phase noise characteristic, whereby the driving currents of said long period signal control coil and short period signal control coil are controlled.

5. A frequency synthesizer recited in any one of claims 1 to 4, wherein each of said long period signal control coil control system and said short period signal control coil control system comprises a phase detector which is provided with a reference signal of a reference signal generator and an output of the oscillator via a variable frequency divider.

6. A frequency synthesizer recited in claim 5, wherein a mixer is connected to said variable frequency divider, said mixer supplying a mixed signal of the output of said oscillator and an output of a local oscillator to said variable frequency divider.

7. A frequency synthesizer for stabilizing an oscillating frequency of an oscillator comprising:
a magnetic resonator;
a magnetic circuit coupled to the magnetic resonator, for applying a magnetic field to the magnetic resonator, the magnetic circuit including a long period coil driven by a long period driving current, and a short period coil driven by a short period driving current, the long period coil and the short period coil for generating the magnetic field; and
a control system, coupled to the magnetic circuit, for controlling the magnetic field to stabilize the oscillating frequency, the control system including a long period control system for controlling the long period driving current and a short period control system for controlling the short period driving current.

8. A frequency synthesizer as recited in claim 7, wherein:
the long period control system includes a first filter having an upper band cut-off frequency for blocking frequencies of a long period input signal above the upper band; and
the short period control system includes a second filter having an upper band cut-off frequency higher than the cut-off frequency of the first filter to pass short period input signals blocked from the long period control system.

9. A frequency synthesizer as recited in claim 7, wherein each of said long period control system and said short period control system comprises:
a variable frequency divider, coupled to the oscillator, providing an oscillator output;
a reference signal generator, coupled to the variable frequency divider, receiving the oscillator output and providing a reference signal; and
a phase detector, coupled to the variable frequency divider and the reference signal generator, receiving the oscillator output and the reference signal and producing a filter input signal.

10. A frequency synthesizer as recited in claim 9, further comprising:
a local oscillator, coupled to the variable frequency divider, for producing an output signal; and
a mixer, coupled to the local oscillator, the oscillator and the variable frequency divider, the mixer receiving the oscillator output and the local oscillator output signal and providing the oscillator output and the local oscillator output signal to the variable frequency divider.

11. A frequency synthesizer for stabilizing an oscillating frequency of an oscillator comprising:
a magnetic resonator;
a magnetic circuit coupled to the magnetic resonator, for applying a magnetic field to the magnetic resonator, the magnetic circuit including a bias coil driven by a DC bias driving current, a long period coil driven by a long period driving current, and a short period coil driven by a short period driving current, the long period coil and the short period coil having inductances smaller than an inductance of the bias coil, the long period coil and the short period coil for generating the magnetic field;
a control system, coupled to the magnetic circuit, for controlling the magnetic field to stabilize the oscillating frequency, the control system including a bias coil control system for controlling the DC bias driving current, a long period control system for controlling the long period driving current and a short period control system for controlling the short period driving current.

12. A frequency synthesizer as recited in claim 11, wherein:
the long period control system includes a first filter having an upper band cut-off frequency for blocking frequencies of a long period input signal above the upper band; and
the short period control system includes a second filter having an upper band cut-off frequency higher than the cut off frequency of the first filter to pass short period input signal blocked from the long period control system.

13. A frequency synthesizer as recited in claim 11, wherein each of said long period control system and said short period control system comprises:

a variable frequency divider, coupled to the oscillator, providing an oscillator output;

a reference signal generator, coupled to the variable frequency divider, receiving the oscillator output and providing a reference signal; and a phase detector, coupled to the variable frequency divider and the reference signal generator, receiving the oscillator output and the reference signal and producing a filter input signal.

14. A frequency synthesizer recited in claim 13, further comprising:

a local oscillator, coupled to the variable frequency divider, for producing an output signal; and a mixer, coupled to the local oscillator, the oscillator and the variable frequency divider, receiving the oscillator output and the local oscillator output signal and providing the oscillator output and the local oscillator output signal to the variable frequency divider.

15. A frequency synthesizer for stabilizing an oscillating frequency of an oscillator comprising:

a magnetic resonator;

a magnetic circuit coupled to the magnetic resonator, for applying a magnetic field to the magnetic resonator, the magnetic circuit including a long period coil driven by a long period driving current and a DC bias current, and a short period coil driven by a short period driving current, the long period coil and the short period coil for generating the magnetic field;

a control system, coupled to the magnetic circuit, for controlling the magnetic field to stabilize the oscillating frequency, the control system including a bias coil control system for controlling the DC bias current, a long period control system for controlling the long period driving current and a short period control system for controlling the short period driving current.

16. A frequency synthesizer as recited in claim 15, wherein:

the long period control system includes a first filter having an upper band cut-off frequency for blocking frequencies of a long period input signal above the upper band; and the short period control system includes a second filter having an upper band cut-off frequency higher than the cut-off frequency of the first filter to pass short period input signals blocked from the long period control system.

17. A frequency synthesizer as recited in claim 15, wherein each of said long period control system and said short period control system comprises:

a variable frequency divider, coupled to the oscillator, providing an oscillator output;

a reference signal generator, coupled to the variable frequency divider, receiving the oscillator output and providing a reference signal; and a phase detector, coupled to the variable frequency divider and the reference signal generator, receiving the oscillator output and the reference signal and producing a filter input signal.

18. A frequency synthesizer recited in claim 17, further comprising:

a local oscillator, coupled to the variable frequency divider, for producing an output signal; and a mixer, coupled to the local oscillator, the oscillator and the variable frequency divider, receiving the oscillator output and the local oscillator output signal and providing the oscillator output and the local oscillator output signal to the variable frequency divider.

* * * * *